(12) United States Patent
Breva et al.

(10) Patent No.: US 11,094,848 B2
(45) Date of Patent: Aug. 17, 2021

(54) LIGHT-EMITTING DIODE CHIP STRUCTURES

(71) Applicant: Cree, Inc., Durham, NC (US)

(72) Inventors: Luis Breva, Morrisville, NC (US); Colin Stuart, Durham, NC (US); Michael Check, Apex, NC (US)

(73) Assignee: CreeLED, Inc., Durham, NC (US)

( * ) Notice: Subject to any disclaimer, the term of this patent is extended or adjusted under 35 U.S.C. 154(b) by 14 days.

(21) Appl. No.: 16/542,458

(22) Filed: Aug. 16, 2019

(65) Prior Publication Data

US 2021/0050482 A1 Feb. 18, 2021

(51) Int. Cl.
| | |
|---|---|
| *H01L 33/38* | (2010.01) |
| *H01L 33/40* | (2010.01) |
| *H01L 33/46* | (2010.01) |
| *H01L 33/62* | (2010.01) |

(Continued)

(52) U.S. Cl.
CPC .......... *H01L 33/382* (2013.01); *H01L 33/405* (2013.01); *H01L 33/46* (2013.01); *H01L 33/62* (2013.01); *H01L 33/22* (2013.01); *H01L 33/32* (2013.01)

(58) Field of Classification Search
CPC ....... H01L 33/382; H01L 33/62; H01L 33/46; H01L 33/405; H01L 33/32; H01L 33/22
See application file for complete search history.

(56) References Cited

U.S. PATENT DOCUMENTS

| | | |
|---|---|---|
| 5,739,554 A | 4/1998 | Edmond et al. |
| 6,657,236 B1 | 12/2003 | Thibeault et al. |
| 6,747,298 B2 | 6/2004 | Slater, Jr. et al. |

(Continued)

FOREIGN PATENT DOCUMENTS

| | | |
|---|---|---|
| CN | 104037277 A | 9/2014 |
| CN | 107452846 A | 12/2017 |

(Continued)

OTHER PUBLICATIONS

Notification of First Office Action for Chinese Patent Application No. 2016800703748, dated Feb. 6, 2020, 13 pages.

(Continued)

*Primary Examiner* — Kyoung Lee
(74) *Attorney, Agent, or Firm* — Withrow & Terranova, PLLC

(57) ABSTRACT

Solid-state lighting devices including light-emitting diodes (LEDs) and more particularly LED chip structures are disclosed. LED chip structures are disclosed that include reduced bonding topography between active LED structures and carrier submounts. For certain LED chip structures, active LED structures are formed on a growth substrate and subsequently bonded to a carrier substrate. Bonding between active LED structures and carrier submounts is typically provided by metal bonding materials. By providing reduced bonding topography between active LED structures and carrier submounts, bonding strength of metal bonding materials may be improved. Electrical connection configurations for certain layers of active LED structures are disclosed that promote reduced bonding topography. Peripheral border configurations of carrier submounts are also disclosed with that promote reduced bonding topography along the peripheral borders.

28 Claims, 9 Drawing Sheets

(51) Int. Cl.
*H01L 33/22* (2010.01)
*H01L 33/32* (2010.01)

(56) References Cited

U.S. PATENT DOCUMENTS

| | | |
|---|---|---|
| 6,784,462 B2 | 8/2004 | Schubert |
| 6,791,119 B2 | 9/2004 | Slater, Jr. et al. |
| 6,821,804 B2 | 11/2004 | Thibeault et al. |
| 6,888,167 B2 | 5/2005 | Slater, Jr. et al. |
| 7,211,803 B1 | 5/2007 | Dhurjaty et al. |
| 7,326,967 B2 | 2/2008 | Hsieh et al. |
| 7,622,746 B1 | 11/2009 | Lester et al. |
| 7,829,906 B2 | 11/2010 | Donofrio |
| 7,880,181 B2 | 2/2011 | Yoon et al. |
| 7,915,629 B2 | 3/2011 | Li et al. |
| 8,017,963 B2 | 9/2011 | Donofrio et al. |
| 8,212,273 B2 | 7/2012 | McKenzie et al. |
| 8,368,100 B2 | 2/2013 | Donofrio et al. |
| 8,471,280 B2 | 6/2013 | Aldaz et al. |
| D691,973 S | 10/2013 | Donofrio et al. |
| 8,575,633 B2 | 11/2013 | Donofrio et al. |
| 8,598,609 B2 | 12/2013 | Ibbetson et al. |
| 8,643,039 B2 | 2/2014 | Donofrio et al. |
| 8,680,556 B2 | 3/2014 | Ibbetson et al. |
| 8,710,536 B2 | 4/2014 | Ibbetson et al. |
| 8,866,169 B2 | 10/2014 | Emerson et al. |
| 8,940,561 B2 | 1/2015 | Donofrio et al. |
| 9,000,470 B2 | 4/2015 | Tudorica et al. |
| 9,070,850 B2 | 6/2015 | Keller et al. |
| 9,362,459 B2 | 6/2016 | Heikman et al. |
| 9,412,907 B1 | 8/2016 | Place et al. |
| 9,461,201 B2 | 10/2016 | Heikman et al. |
| 9,887,327 B2 | 2/2018 | Reiherzer |
| 10,236,414 B2 | 3/2019 | Lee et al. |
| 2003/0025212 A1 | 2/2003 | Bhat et al. |
| 2003/0230754 A1 | 12/2003 | Steigerwald et al. |
| 2005/0255619 A1 | 11/2005 | Negro et al. |
| 2005/0274956 A1* | 12/2005 | Bhat ................. H01L 27/15 257/79 |
| 2008/0179611 A1 | 7/2008 | Chitnis et al. |
| 2008/0246047 A1 | 10/2008 | Hsu et al. |
| 2009/0146165 A1 | 6/2009 | Hasnain et al. |
| 2009/0283787 A1 | 11/2009 | Donofrio et al. |
| 2010/0140635 A1 | 6/2010 | Ibbetson et al. |
| 2011/0305021 A1 | 12/2011 | Xin |
| 2012/0049219 A1 | 3/2012 | Kamiya et al. |
| 2012/0049756 A1 | 3/2012 | Schubert |
| 2012/0074441 A1 | 3/2012 | Seo et al. |
| 2012/0193660 A1 | 8/2012 | Donofrio et al. |
| 2012/0193662 A1 | 8/2012 | Donofrio et al. |
| 2012/0326159 A1 | 12/2012 | Bergmann et al. |
| 2013/0058102 A1 | 3/2013 | Lin |
| 2013/0141920 A1 | 6/2013 | Emerson et al. |
| 2013/0264592 A1 | 10/2013 | Bergmann et al. |
| 2013/0328096 A1 | 12/2013 | Donofrio et al. |
| 2013/0341634 A1 | 12/2013 | Heikman et al. |
| 2014/0070245 A1 | 3/2014 | Haberern et al. |
| 2014/0203320 A1 | 7/2014 | Ibbetson et al. |
| 2015/0140710 A1 | 5/2015 | McLaurin et al. |
| 2015/0179879 A1 | 6/2015 | Yang et al. |
| 2015/0179903 A1 | 6/2015 | Pun et al. |
| 2015/0295138 A1 | 10/2015 | Chae et al. |
| 2015/0380621 A1 | 12/2015 | Chae et al. |
| 2016/0155901 A1 | 6/2016 | Lopez et al. |
| 2016/0211420 A1 | 7/2016 | Donofrio et al. |
| 2016/0260869 A1 | 9/2016 | Jeon et al. |
| 2017/0012175 A1 | 1/2017 | Wang et al. |
| 2017/0084787 A1 | 3/2017 | Emura et al. |
| 2017/0098746 A1 | 4/2017 | Bergmann et al. |
| 2017/0108173 A1 | 4/2017 | Kim et al. |
| 2017/0149211 A1 | 5/2017 | Jeong et al. |
| 2017/0210277 A1* | 7/2017 | Harada .................. H01L 33/20 |
| 2017/0294417 A1 | 10/2017 | Edmond et al. |
| 2017/0294418 A1 | 10/2017 | Edmond et al. |
| 2017/0331009 A1 | 11/2017 | Shioji |
| 2018/0114878 A1 | 4/2018 | Danesh et al. |
| 2018/0254386 A1* | 9/2018 | Perzlmaier .............. H01L 33/62 |
| 2019/0051805 A1 | 2/2019 | Oh et al. |
| 2019/0237630 A1 | 8/2019 | Check |

FOREIGN PATENT DOCUMENTS

| | | |
|---|---|---|
| CN | 107546303 A | 1/2018 |
| WO | 2012086483 A1 | 6/2012 |

OTHER PUBLICATIONS

Intention to Grant for European Patent Application No. 16778642.5, dated Feb. 27, 2020, 93 pages.
International Search Report and Written Opinion for International Patent Application No. PCT/US2019/059331, dated Jan. 27, 2020, 19 pages.
Non-Final Office Action for U.S. Appl. No. 15/280,438, dated Jan. 22, 2020, 17 pages.
Final Office Action for U.S. Appl. No. 15/882,103, dated Feb. 6, 2020, 23 pages.
Advisory Action, Examiner-Initiated Interview Summary, and AFCP 2.0 Decision for U.S. Appl. No. 15/882,103, dated Mar. 16, 2020, 7 pages.
Non-Final Office Action for U.S. Appl. No. 16/222,173, dated Feb. 14, 2020, 13 pages.
Author Unknown, "Cree® XLamp® XB-D and XT-E LED Optical Design Considerations," Application Note, CLD-AP104 Rev 0B, www.cree.com/Xlamp, 2014, Cree, Inc., pp. 1-15.
Carey, Julian, "New LED architectures and phosphor technologies lower costs and boost quality," (Magazine), LED Design & Manufacturing, vol. 11, Issue 7, Sep. 4, 2014, Tulsa, OK, PennWell Corporation, pp. 1-16.
Kim, Jong Kyu et al., "GaInN light-emitting diodes with $RuO_2$/$SiO_2$/Ag omni-directional reflector," Applied Physics Letters, vol. 84, Issue 22, May 31, 2004, American Institute of Physics, pp. 4508-4510.
Palik, E. D., ed., "Handbook of Optical Constants of Solids: Volume One," Academic Press, 1985, 785 pages.
Wright, Maury, "Strategies in Light to span SSL technology and business domains," (Magazine), SSL Design, vol. 12, Issue 2, Feb. 16, 2015, Tulsa, OK, PennWell Corporation, pp. 1-22.
Non-Final Office Action for U.S. Appl. No. 15/280,438, dated May 8, 2018, 26 pages.
International Search Report and Written Opinion for International Patent Application No. PCT/US2016/054372, dated Dec. 19, 2016, 16 pages.
International Preliminary Report on Patentability for International Patent Application No. PCT/US2016/054372, dated Apr. 3, 2018, 9 pages.
Bruschi, Lorenzo et al., "Adsorption in alumina pores open at one and at both ends," Nanoscale, vol. 7, Issue 6, Feb. 14, 2015, Royal Society of Chemistry, pp. 2587-2596.
Bruschi, Lorenzo et al., "Supporting Information: Adsorption in alumina pores open at one and at both ends," Electronic Supplementary Material (ESI) for Nanoscale, 2014, http://www.rsc.org/suppdata/nr/c4/c4nr06469k/c4nr06469k1.pdf, Royal Society of Chemistry, 3 pages.
Zhao, S. et al., "Enhanced luminous efficiency of phosphor-converted LEDs by using back reflector to increase reflectivity for yellow light," Applied Optics, vol. 53, No. 34, Dec. 1, 2014, Optical Society of America, pp. 8104-8110.
Zhao, Y.S. et al., "Efficiency Enhancement of InGaN/GaN Light-Emitting Diodes with a Back-Surface Distributed Bragg Reflector," Journal of Electronic Materials, vol. 32, No. 12, 2003, Springer-Verlag, pp. 1523-1526.
Final Office Action for U.S. Appl. No. 15/280,438, dated Nov. 1, 2018, 26 pages.
Advisory Action, Interview Summary, and AFCP 2.0 Decision for U.S. Appl. No. 15/280,438, dated Dec. 13, 2018, 7 pages.
Non-Final Office Action and Examiner-Initiated Interview Summary for U.S. Appl. No. 15/280,438, dated May 3, 2019, 23 pages.

(56) References Cited

OTHER PUBLICATIONS

Final Office Action and Examiner-Initiated Interview Summary for U.S. Appl. No. 15/280,438, dated Sep. 13, 2019, 23 pages.
Examination Report for European Patent Application No. 16778642.5, dated Apr. 26, 2019, 5 pages.
Non-Final Office Action for U.S. Appl. No. 15/882,103, dated Aug. 20, 2019, 16 pages.
International Search Report and Written Opinion for International Patent Application No. PCT/US2019/015418, dated May 14, 2019, 19 pages.
Non-Final Office Action and Examiner-Initiated Interview Summary for U.S. Appl. No. 15/280,438, dated Jul. 7, 2020, 22 pages.
International Preliminary Report on Patentability for International Patent Application No. PCT/US2019/015418, dated Aug. 13, 2020, 12 pages.
Notice of Allowance for U.S. Appl. No. 16/222,173, dated May 29, 2020, 10 pages.
Non-Final Office Action for U.S. Appl. No. 16/357,949, dated Jun. 10, 2020, 10 pages.
Non-Final Office Action for U.S. Appl. No. 15/882,103, dated Jun. 15, 2020, 14 pages.
Non-Final Office Action for U.S. Appl. No. 15/882,103, dated Jun. 17, 2020, 14 pages.
Advisory Action, Interview Summary, and AFCP 2.0 Decision for U.S. Appl. No. 15/280,438, dated Nov. 27, 2019, 6 pages.
Final Office Action for U.S. Appl. No. 16/357,949, dated Sep. 30, 2020, 9 pages.
Notification of the Second Office Action for Chinese Patent Application No. 201680070374.8, dated Sep. 25, 2020, 15 pages.
Notice of Allowance for U.S. Appl. No. 15/280,438, dated Dec. 23, 2020, 9 pages.
Ex-Parte Quayle Action for U.S. Appl. No. 15/882,103, mailed Dec. 11, 2020, 6 pages.
Notice of Allowance for U.S. Appl. No. 16/357,949, dated Dec. 24, 2020, 8 pages.
Notice of Allowance for U.S. Appl. No. 15/882,103, dated Feb. 18, 2021, 9 pages.

* cited by examiner

LIGHT-EMITTING DIODE CHIP STRUCTURES

FIELD OF THE DISCLOSURE

The present disclosure relates to solid-state lighting devices including light-emitting diodes (LEDs) and more particularly to LED chip structures.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An active region may be fabricated, for example, from silicon carbide, gallium nitride, gallium phosphide, aluminum nitride, and/or gallium arsenide-based materials and/or from organic semiconductor materials. Photons generated by the active region are initiated in all directions.

Typically, it is desirable to operate LEDs at the highest light emission efficiency, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment will be either refracted or internally reflected. If photons are internally reflected in a repeated manner, then such photons will eventually be absorbed and never provide visible light that exits an LED. To increase the opportunity for photons to exit an LED, it has been found useful to pattern, roughen, or otherwise texture the interface between an LED surface and the surrounding environment to provide a varying surface that increases the probability of refraction over internal reflection and thus enhances light extraction. Reflective surfaces may also be provided to reflect generated light so that such light may contribute to useful emission from an LED chip. LEDs have been developed with internal reflective surfaces or layers to reflect generated light.

The quantum efficiency of an LED can also be limited by other factors, such as how well current is able to spread within an LED. To increase current spreading for LEDs, and in particular for larger area LEDs, it has been found useful to add layers of high electrical conductivity over one or more epitaxial layers of an LED. Additionally, electrodes for LEDs can have larger surface areas and may include various electrode extensions or fingers that are configured to route and more evenly distribute current across an LED.

As advancements in modern LED technology progress, the art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs) and more particularly to LED chip structures. LED chip structures are disclosed herein that include reduced bonding topography between active LED structures and carrier submounts. Active LED structures typically include an active layer that is arranged between an n-type layer and a p-type layer. For certain LED chip structures, active LED structures are formed on a growth substrate and subsequently bonded to a carrier substrate. Bonding between active LED structures and carrier submounts typically includes various metal bonding techniques, such as eutectic bonding, where metal bonding materials are provided to bond active LED structures to carrier submounts. By providing reduced bonding topography between active LED structures and carrier submounts, bonding strength may be improved. Electrical connection configurations for certain layers of active LED structures are disclosed that promote reduced bonding topography. Peripheral border configurations of carrier submounts are also disclosed that promote reduced bonding topography along the peripheral borders.

In one aspect, an LED chip comprises: an active LED structure comprising an n-type layer, a p-type layer, and an active layer arranged between the n-type layer and the p-type layer, the active LED structure forming a first opening that extends through the p-type layer, the active layer, and a first portion of the n-type layer; a passivation layer in the first opening and on a first surface of the n-type layer that is within the first opening, the n-type layer forming a second opening that extends from the first surface of the n-type layer and through a second portion of the n-type layer; and an n-contact interconnect that extends through the first surface of the n-type layer to electrically connect with a second surface of the n-type layer. In certain embodiments, the first surface of the n-type layer and the second surface of the n-type layer are arranged along different horizontal planes of the n-type layer. In certain embodiments, the second opening is devoid of the passivation layer. In certain embodiments, a lateral diameter of the first opening is greater than a lateral diameter of the second opening. In certain embodiments, the p-type layer, the active layer, and the n-type layer form an active LED structure mesa, and a third surface of the n-type layer forms a peripheral mesa border of the active LED structure mesa. In certain embodiments, the third surface of the n-type layer is arranged along a same horizontal plane as the first surface of the n-type layer. In certain embodiments, the active LED structure is bonded to a carrier submount such that the p-type layer is closer to the carrier submount than the n-type layer. In certain embodiments, at least one bonding metal layer is arranged between the p-type layer and the carrier submount. In certain embodiments, the LED chip may comprise a light-transmissive substrate. In certain embodiments, the LED chip may comprise a reflective structure on the p-type layer, wherein the reflective structure comprises a dielectric reflective layer and a metal reflective layer. In certain embodiments, the metal reflective layer forms a plurality of reflective layer interconnects that extend through an entire thickness of the dielectric reflective layer.

In another aspect, an LED comprises: an active LED structure comprising an n-type layer, a p-type layer, and an active layer arranged between the n-type layer and the p-type layer, the active LED structure forming an active LED structure mesa with a peripheral mesa border that is arranged along a first horizontal plane of the n-type layer; and an n-contact interconnect that is arranged through the p-type layer, the active layer, and a portion of the n-type layer such that the n-contact interconnect is electrically connected to n-type layer along a second horizontal plane of the n-type layer that is different than the first horizontal plane of the n-type layer. In certain embodiments, the first horizontal plane is arranged closer to the active layer than the second horizontal plane. In certain embodiments, the active LED structure forms an active LED structure mesa and a third surface of the n-type layer forms a peripheral mesa border of the active LED structure mesa. In certain embodiments, the third surface of the n-type layer is arranged along the first horizontal plane. In certain embodiments, the active LED structure is bonded to a carrier submount. In certain embodiments, the LED chip may comprise a light-transmissive substrate.

In another aspect, an LED chip comprises: an active LED structure comprising an n-type layer, a p-type layer, and an active layer arranged between the n-type layer and the p-type layer; a carrier submount bonded to the active LED structure such that a peripheral border of the carrier submount is devoid of the active LED structure; and a first passivation layer arranged between the active LED structure and the carrier submount, the first passivation layer further arranged to extend along the peripheral border; and a second passivation layer arranged along the peripheral border such that the second passivation layer is laterally spaced from the active LED structure by the first passivation layer. In certain embodiments, the second passivation layer comprises silicon dioxide. In certain embodiments, the first passivation layer comprises silicon nitride. In certain embodiments, the second passivation layer comprises a plurality of alternating layers of dielectric materials. In certain embodiments, the second passivation layer forms a stripe along the peripheral border. In certain embodiments, the LED chip may further comprise a third passivation layer that is over the active LED structure such that a portion of the active LED structure is between the third passivation layer and the carrier submount, the third passivation layer is further arranged over the first passivation layer and the second passivation layer on the peripheral border of the carrier submount. In certain embodiments, an interface is formed between the first passivation layer and the third passivation layer along the peripheral border of the carrier submount and the interface is closer to the active LED structure than the second passivation layer. In certain embodiments, the LED chip may further comprise a bonding material arranged between the carrier submount and the active LED structure and along the peripheral border of the carrier submount. In certain embodiments, along the peripheral border, the bonding material may form a first thickness adjacent a lateral edge of the carrier submount that is less than a second thickness of the bonding material along the peripheral border. In certain embodiments, the LED chip further comprises a reflective structure on the p-type layer, wherein the reflective structure comprises a dielectric reflective layer and a metal reflective layer. In certain embodiments, the dielectric reflective layer and the second passivation layer comprise the same material.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
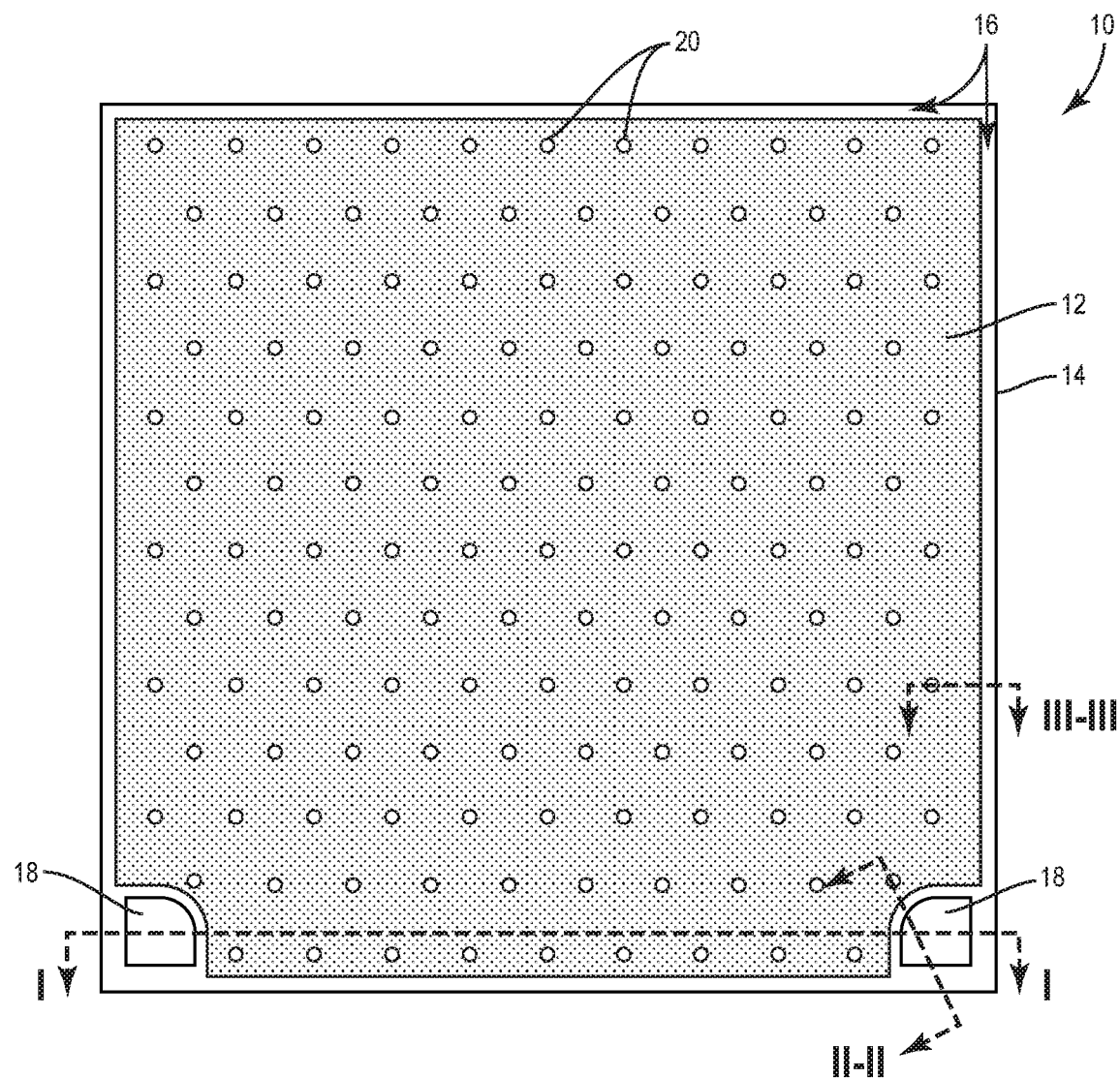
FIG. 1A is a top view illustration of a representative LED chip according to embodiments disclosed herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

As illustrated in various figures, sizes of structures or portions may be exaggerated relative to other structures or portions for illustrative purposes and, thus, are provided to illustrate the general structures of the present subject matter and may or may not be drawn to scale.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to solid-state lighting devices including light-emitting diodes (LEDs) and more particularly to LED chip structures. LED chip structures are disclosed herein that include reduced bonding topography between active LED structures and carrier submounts. Active LED structures typically include an active layer that is arranged between an n-type layer and a p-type layer. For certain LED chip structures, active LED structures are formed on a growth substrate and subsequently bonded to a carrier substrate. Bonding between active LED structures and carrier submounts typically includes various metal bonding techniques, such as eutectic bonding, where metal bonding materials are provided to bond active LED structures to carrier submounts. By providing reduced bonding topography between active LED structures and carrier submounts, bonding strength may be improved. Electrical connection configurations for certain layers of active LED structures are disclosed that promote reduced bonding topography. Peripheral border configurations of carrier submounts are also disclosed that promote reduced bonding topography along the peripheral borders.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm.

An LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip and/or a submount in various configurations. In certain embodiments, one or more surfaces of LED chips may be conformally coated with one or more lumiphoric materials, while other surfaces of such LED chips and/or associated submounts may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

Light emitted by the active layer or region of an LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflective layer and a dielectric reflective layer, wherein the dielectric reflective layer is arranged between the metal reflective layer and a plurality of semiconductor layers. A passivation layer is arranged between the metal reflective layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. In certain embodiments, a vertical geometry or lateral geometry LED chip may be configured as set forth in the commonly-assigned U.S. Pat. No. 9,461,201, which is hereby incorporated by reference herein. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In certain embodiments, the flip-chip LED chip may be configured as described in commonly-assigned U.S. Patent Application Publication No. 2017/0098746, now U.S. Pat. No. 10,991,861, which is hereby incorporated by reference herein. In other embodiments, an active LED structure may be bonded to a carrier submount, and the growth substrate may be removed such that light may exit the active LED structure without passing through the growth substrate. In certain embodiments, an LED package may be configured as set forth in the following commonly-assigned U.S. patents and U.S. publications, which are hereby incorporated by reference herein: U.S. Pat. Nos. 8,866,169; 9,070,850; 9,887,327; and U.S. Patent Application Publication No. 2015/0179903, now U.S. Pat. No. 10,468,565.

Figure 1B:
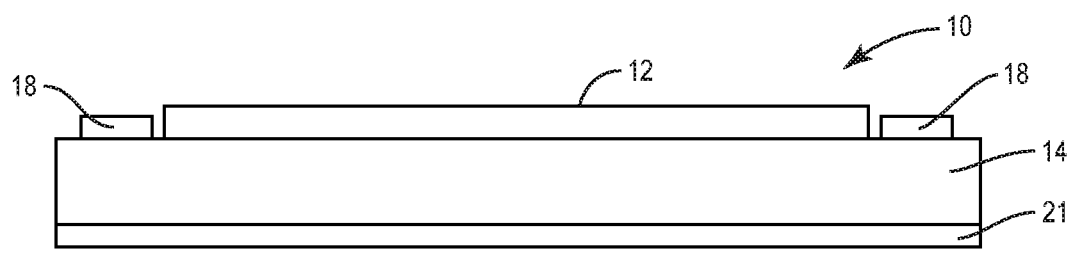
FIG. 1B is a general cross-sectional view of the LED chip FIG. 1A taken along the sectional line I-I.

FIG. 1A is a top view illustration of a representative LED chip 10 according to embodiments disclosed herein. FIG. 1B is a general cross-sectional view taken along the sectional line I-I of FIG. 1A. The LED chip 10 comprises an active LED structure 12 that generally includes an active layer sandwiched between n-type and p-type oppositely doped epitaxial layers, which are initially formed successively on a growth substrate. In FIG. 1A, the active LED structure 12 is bonded to a carrier submount 14 and the growth substrate has been removed. The carrier submount 14 can be made of many different materials, with a suitable material being silicon. In certain embodiments, the carrier submount 14 comprises an electrically conductive material. As illustrated, the active LED structure 12 does not cover an entire surface area of the carrier submount 14 in certain embodiments. As such, a peripheral border 16 of the carrier submount 14 may be formed that is devoid of the active LED structure 12. The LED chip 10 may further include one or more p-contacts 18, or anodes, that are configured to provide an electrical connection to a p-type layer of the active LED structure 12. While two p-contacts 18 are illustrated, the LED chip 10 may include a single p-contact 18 or more than two p-contacts 18 depending on a relative size of the LED chip 10. For example, a larger size or surface area of the LED chip 10 may generally correspond with an increase in a number of p-contacts 18 to provide increased current spreading. The LED chip 10 may comprise a plurality of n-contact interconnects 20 that pass through portions of the active LED structure 12 to provide an electrical connection to an n-type layer of the active LED structure 12. The n-contact interconnects 20 may be provided at least partially within the active LED structure 12 and may be visible through the active LED structure 12 from the top view illustrated in FIG. 1A. The n-contact interconnects 20 are electrically connected to a n-contact 21, or cathode, that may be provided on an opposite face of the carrier submount 14 than the active LED structure 12 as illustrated in FIG. 1B. In this manner, the LED chip 10 is configured to be mounted to an LED package or fixture submount at the n-contact 21, and light may exit the LED chip 10 through the active LED structure 12 in a primary direction away from the carrier submount 14. After mounting to an LED package or fixture, the n-contact 21 may be electrically mounted and bonded to a first electrical connection (e.g., a cathode electrical trace) and the one or more p-contacts 18 may be wirebonded to a second electrical connection (e.g., an anode electrical trace).

Figure 2A:
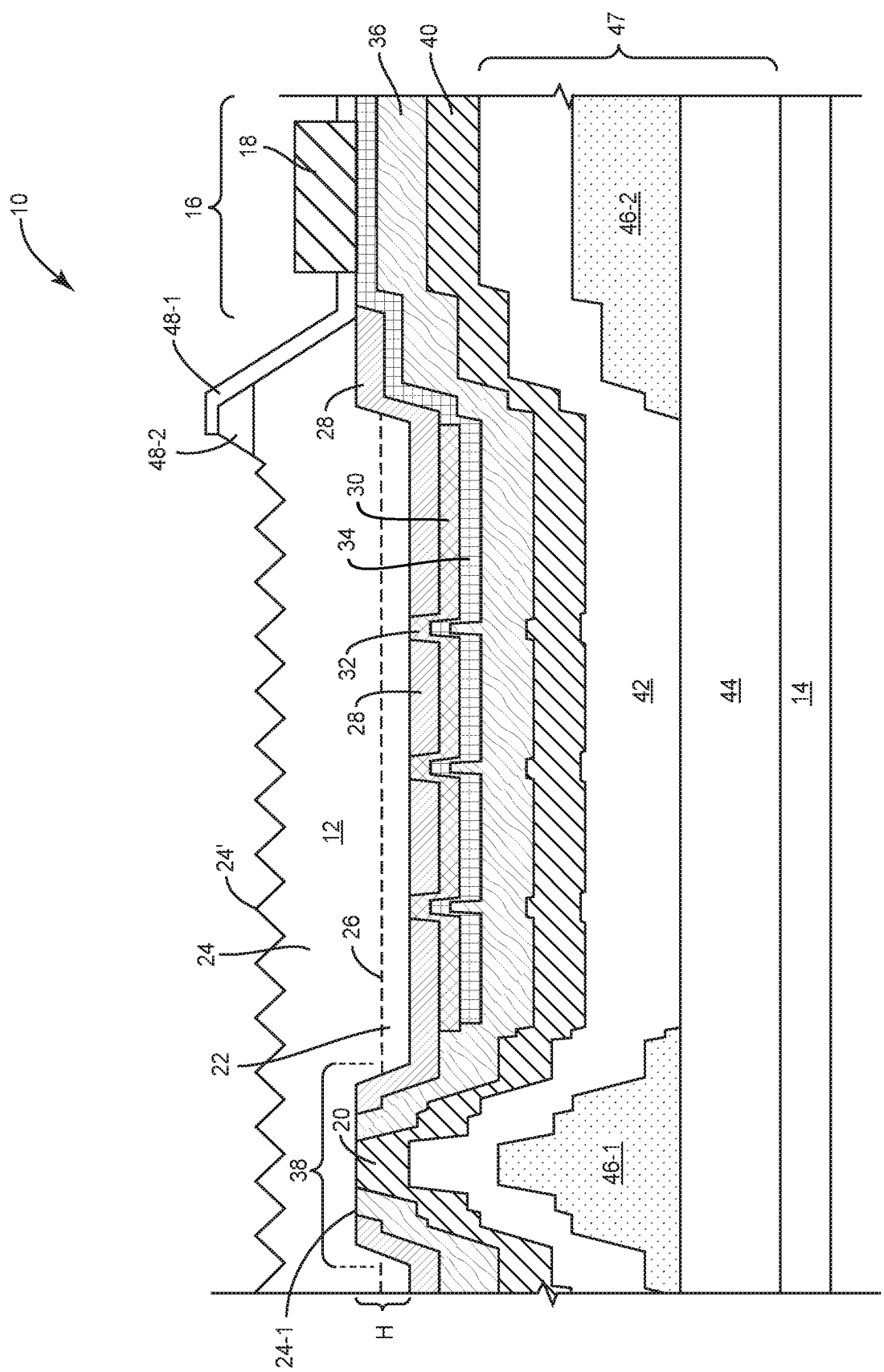
FIG. 2A is a partial cross-sectional view of the LED chip FIG. 1A taken along the sectional line II-II.

FIG. 2A is a partial cross-sectional view taken along the sectional line II-II of FIG. 1A. The active LED structure 12 of the LED chip 10 generally includes a p-type layer 22, an n-type layer 24, and an active layer 26 arranged between the n-type layer 24 and the p-type layer 22. The active LED structure 12 may include many additional layers such as, but not limited to, buffer layers, nucleation layers, super lattice structures, un-doped layers, cladding layers, contact layers, current-spreading layers, and light extraction layers and elements. Additionally, the active layer 26 may comprise a single quantum well, a multiple quantum well, a double heterostructure, or super lattice structures. In FIG. 2A, the p-type layer 22 is arranged between the active layer 26 and the carrier submount 14 such that the p-type layer 22 is closer to the carrier submount 14 than the n-type layer 24. The active LED structure 12 may initially be formed by epitaxially growing or depositing the n-type layer 24, the active layer 26, and the p-type layer 22 sequentially on a growth substrate. The active LED structure 12 is then flipped and bonded to the carrier submount 14 and the growth substrate is removed. In this manner, a top surface 24' of the n-type layer 24 forms a primary light extracting face of the LED chip 10. In certain embodiments, the top surface 24' may comprise a textured or patterned surface for improving light extraction. In other embodiments, the doping order may be reversed such that n-type layer 24 is arranged between the active layer 26 and the carrier submount 14.

The LED chip 10 may include a first reflective layer 28 that is arranged on the p-type layer 22 such that the first reflective layer 28 is arranged between the p-type layer 22 and the carrier submount 14. In certain embodiments, a current spreading layer (not shown) may be provided between the p-type layer 22 and the first reflective layer 28. The current spreading layer may include a thin layer of a transparent conductive oxide such indium tin oxide (ITO) or a metal such as platinum (Pt), although other materials may be used. The first reflective layer 28 may comprise many different materials and preferably comprises a material that presents an index of refraction step with the material of the active LED structure 12 to promote total internal reflection (TIR) of light generated from the active LED structure 12. Light that experiences TIR is redirected without experiencing absorption or loss, and can thereby contribute to useful or desired LED chip emission. In certain embodiments, the first reflective layer 28 comprises a material with an index of refraction lower than the index of refraction of the active LED structure 12 material. The first reflective layer 28 may comprise many different materials, with some having an index of refraction less than 2.3, while others can have an index of refraction of the first reflective layer 28 may be less than 2.15, less than 2.0, or less than 1.5. In certain embodiments, the first reflective layer 28 comprises a dielectric material to form a dielectric reflective layer, with some embodiments comprising silicon dioxide ($SiO_2$) and/or silicon nitride (SiN). As used herein, the general term "silicon nitride" and the abbreviation "SiN" generally refers to various silicon nitride compounds such as $SiN_x$, $Si_yN_x$, $Si_3N_4$, etc. It is understood that many dielectric materials can be used such as SiN, SiNx, $Si_yN_x$, $Si_3N_4$, Si, germanium (Ge), $SiO_2$, SiOx, titanium dioxide ($TiO_2$), tantalum pentoxide ($Ta_2O_5$), ITO, magnesium oxide (MgOx), zinc oxide (ZnO), and combinations thereof. In certain embodiments, the first reflective layer 28 may include multiple alternating layers of different dielectric materials, e.g., alternating layers of $SiO_2$ and SiN that symmetrically repeat or are asymmetrically arranged. Some Group III nitride materials such as GaN can have an index of refraction of approximately 2.4, and $SiO_2$ can have an index of refraction of approximately 1.48, and SiN can have an index of refraction of approximately 1.9. Embodiments with the active LED structure 12 comprising GaN and the first reflective layer 28 comprising $SiO_2$ can have a sufficient index of refraction step between the two to allow for efficient TIR of light. The first reflective layer 28 can have different thicknesses depending on the type of materials used, with some embodiments having a thickness of at least 0.2 microns (μm), or in a range including 0.2 μm to 0.7 μm, or in a range including 0.3 um to 0.6 um, or in a range including 0.4 μm to 0.6 μm.

The LED chip 10 may further include a second reflective layer 30 that is on the first reflective layer 28 such that the first reflective layer 28 is arranged between the active LED structure 12 and the second reflective layer 30. The second reflective layer 30 may include a metal layer that is configured to reflect light from the active LED structure 12 that may pass through the first reflective layer 28. The second reflective layer 30 may comprise many different materials such as Ag, gold (Au), Al, nickel (Ni), titanium (Ti) or combinations thereof. The second reflective layer 30 can have different thicknesses depending on the type of materials used, with some embodiments having a thickness of at least 0.1 µm, or in a range including 0.1 µm to 0.7 µm, or in a range including 0.1 um to 0.5 um, or in a range including 0.1 µm to 0.3 µm. As illustrated, the second reflective layer 30 may include one or more reflective layer interconnects 32 that provide an electrically conductive path through the first reflective layer 28. In this manner, the one or more reflective layer interconnects 32 may extend through an entire thickness of the first reflective layer 28. In certain embodiments, the second reflective layer 30 is a metal reflective layer and the reflective layer interconnects 32 comprise reflective layer metal vias. Accordingly, the first reflective layer 28, the second reflective layer 30, and the reflective layer interconnects 32 form a reflective structure of the LED chip 10 that is on the p-type layer. As such, the reflective structure may comprise a dielectric reflective layer and a metal reflective layer as disclosed herein. In certain embodiments, the reflective layer interconnects 32 comprise the same material as the second reflective layer 30 and are formed at the same time as the second reflective layer 30. In other embodiments, the reflective layer interconnects 32 may comprise a different material than the second reflective layer 30. Some embodiments may also comprise an adhesion layer that is positioned at one or more interfaces between the first reflective layer 28 and the second reflective layer 30 to promote adhesion between the two. Many different materials can be used for the adhesion layer, such as titanium oxide (TiO, $TiO_2$), titanium oxynitride (TiON, $Ti_xO_yN$), tantalum oxide (TaO, $Ta_2O_5$), tantalum oxynitride (TaON), aluminum oxide (AlO, $Al_xO_y$) or combinations thereof, with a preferred material being TiON, AlO, or $Al_xO_y$. In certain embodiments, the adhesion layer comprises $Al_xO_y$, where $1 \leq x \leq 4$ and $1 \leq y \leq 6$. In certain embodiments, the adhesion layer comprises $Al_xO_y$, where x=2 and y=3, or $Al_2O_3$. The adhesion layer may be deposited by electron beam deposition that may provide a smooth, dense, and continuous layer without notable variations in surface morphology. The adhesion layer may also be deposited by sputtering, chemical vapor deposition, or plasma enhanced chemical vapor deposition.

The LED chip 10 may also comprise a barrier layer 34 on the second reflective layer 30 to prevent migration of the second reflective layer 30 material, such as Ag, to other layers. Preventing this migration helps the LED chip 10 maintain efficient operation throughout its lifetime. The barrier layer 34 may comprise an electrically conductive material, with suitable materials including but not limited Ti, Pt, Ni, Au, tungsten (W), and combinations or alloys thereof. In certain embodiments, the barrier layer 34 is arranged to laterally extend beyond the active LED structure 12 to the peripheral border 16 in order to provide an electrical connection with the p-contact 18. In this regard, an electrical path between the p-contact 18 and the p-type layer 22 can include the barrier layer 34, the second reflective layer 30, and the reflective layer interconnects 32. A passivation layer 36 is included on the barrier layer 34 as well as any portions of the second reflective layer 30 that may be uncovered by the barrier layer 34. The passivation layer 36 protects and provides electrical insulation for the LED chip 10 and can comprise many different materials, such as a dielectric material. A suitable material for the passivation layer 36 includes, but is not limited to, silicon nitride. In some embodiments, the passivation layer 36 is a single layer, and in other embodiments, the passivation layer 36 comprises a plurality of layers. In certain embodiments, the passivation layer 36 may include one or more metal-containing interlayers arranged or embedded therein, that may function as a crack stop layer for any cracks that may propagate through the passivation layer 36 as well as an additional light reflective layer.

In FIG. 2A, the active LED structure 12 forms a first opening 38 or recess that extends through the p-type layer 22, the active layer 26, and a portion of the n-type layer 24. The first opening 38 may be formed by a subtractive material process, such as etching, that is applied to the active LED structure 12 before bonding with the carrier submount 14. In this manner, a first surface 24-1 of the n-type layer 24 is formed at a base of the first opening 38. A height H of the first opening 38 may be defined by a vertical distance as measured from the first surface 24-1 to a surface of the p-type layer 22 that is opposite the n-type layer 24. As illustrated, a portion of the first reflective layer 28 is arranged to cover sidewall surfaces of the p-type layer 22, the active layer 26, and the n-type layer 24 within the first opening 38. The passivation layer 36 extends along the first reflective layer 28 in the first opening 38 and is arranged on the first surface 24-1 of the n-type layer 24. The LED chip 10 further includes an n-contact metal layer 40 that is arranged on the passivation layer 36 and across the LED chip 10. At the first opening 38, the n-contact metal layer 40 extends into the first opening 38 to form the n-contact interconnect 20, which may be referred to as an n-contact via. In this manner, the first opening 38 may be defined where portions of the n-contact metal layer 40, the n-contact interconnect 20, the passivation layer 26, and the first reflective layer 28 extend into the active LED structure 12. As such, the n-contact metal layer 40 and the n-contact interconnect 20 may be integrally formed to provide an electrical connection to the n-type layer 24 through the first opening 38. In other embodiments, the n-contact metal layer 40 and the n-contact interconnect 20 may be separately formed and may comprise the same or different materials. In certain embodiments, the n-contact metal layer 40 and the n-contact interconnect 20 comprise a single layer or a plurality of layers that include conductive metals, such as one or more of Al, Ti, and alloys thereof.

In order to facilitate bonding of the active LED structure 12 to the carrier submount 14, a first bonding metal layer 42 is provided on the n-contact metal layer 40 such that the first bonding metal layer 42 is arranged between the p-type layer 22 and the carrier submount 14. The first bonding metal layer 42 may include one or more layers of bond metals including, but not limited to, Au, Sn, Ni, palladium (Pd), Ti, W, and alloys thereof that are formed on the n-contact metal layer 40 before the active LED structure 12 is bonded to the carrier submount 14. In a similar manner, the carrier submount 14 is provided with a second bonding metal layer 44 that may include one or more layers of bond metals including, but not limited to, Au, Sn, Ni, Pd, Ti, W, and alloys thereof that are formed on the carrier submount 14 before bonding with the active LED structure 12. As illustrated, the first bonding metal layer 42 may conformally follow a contour or topography of the n-contact metal layer 40 along the active LED structure 12 and the first opening 38 as well as beyond the active LED structure 12 and along the peripheral border 16 of the carrier submount 14. At the start of bonding, the active LED structure 12 is arranged on the carrier submount 14 such that the first bonding metal layer 42 at least partially contacts the second bonding metal layer 44. As illustrated, one or more bonding regions 46-1, 46-2 are formed that correspond to differences in topography between the first bonding metal layer 42 and the second bonding metal layer 44. In particular, the bonding region 46-1 corresponds or is registered with the first opening 38 and the n-contact interconnect 20, while the bonding region 46-2 corresponds or is registered with the peripheral border 16 and the p-contact 18. During bonding, such as a eutectic bonding process, the first bonding metal layer 42 and the second bonding metal layer 44 are heated to collectively form a bonding material 47 (e.g., one or more eutectic alloys) between the active LED structure 12 and the carrier submount 14 and within the bonding regions 46-1, 46-2. Bonding conditions such as temperature, bonding pressure, and cooling rates may need to be controlled or adjusted to provide adequate bonding strength. If volumes of the bonding regions 46-1, 46-2 are large due to increased topography differences, localized bonding strength in the bonding regions 46-1, 46-2 may be reduced. After bonding and removal of a growth substrate for the active LED structure 12, the top surface 24' of the n-type layer 24 may be textured or patterned. Additionally, the p-contact 18 may be formed on the barrier layer 34 and one or more top passivation layers 48-1, 48-2 may be provided on one or more top or side surfaces of the n-type layer 24. The top passivation layers 48-1, 48-2 may comprise separate layers of a continuous layer of dielectric material, such as silicon nitride.

Figure 2B:
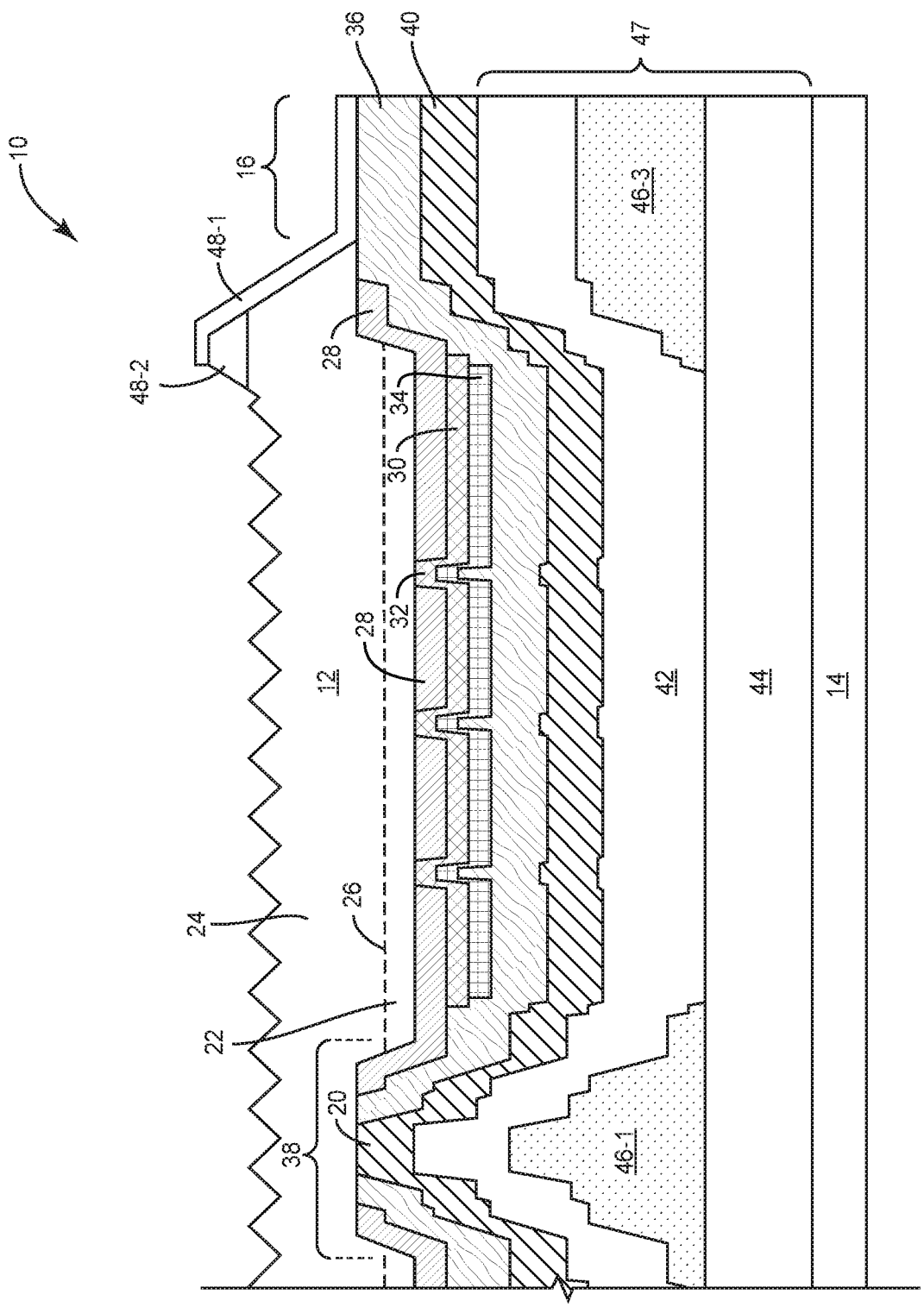
FIG. 2B is a partial cross-sectional view of the LED chip FIG. 1A taken along the sectional line III-III.

FIG. 2B is a partial cross-sectional view taken along the sectional line III-III of FIG. 1A. Since the cross-sectional view of FIG. 2B does not include the p-contact (18 of FIG. 2A), the barrier layer 34 does not extend into or across the peripheral border 16 of the carrier submount 14. As such, a bonding region 46-3 is formed along the peripheral border 16 that is outside of the p-contact 18 of FIG. 2A. Due to the absence of the barrier layer 34, the bonding region 46-3 has an increased volume or thickness compared with the bonding region 46-2 of FIG. 2A.

Figure 3A:
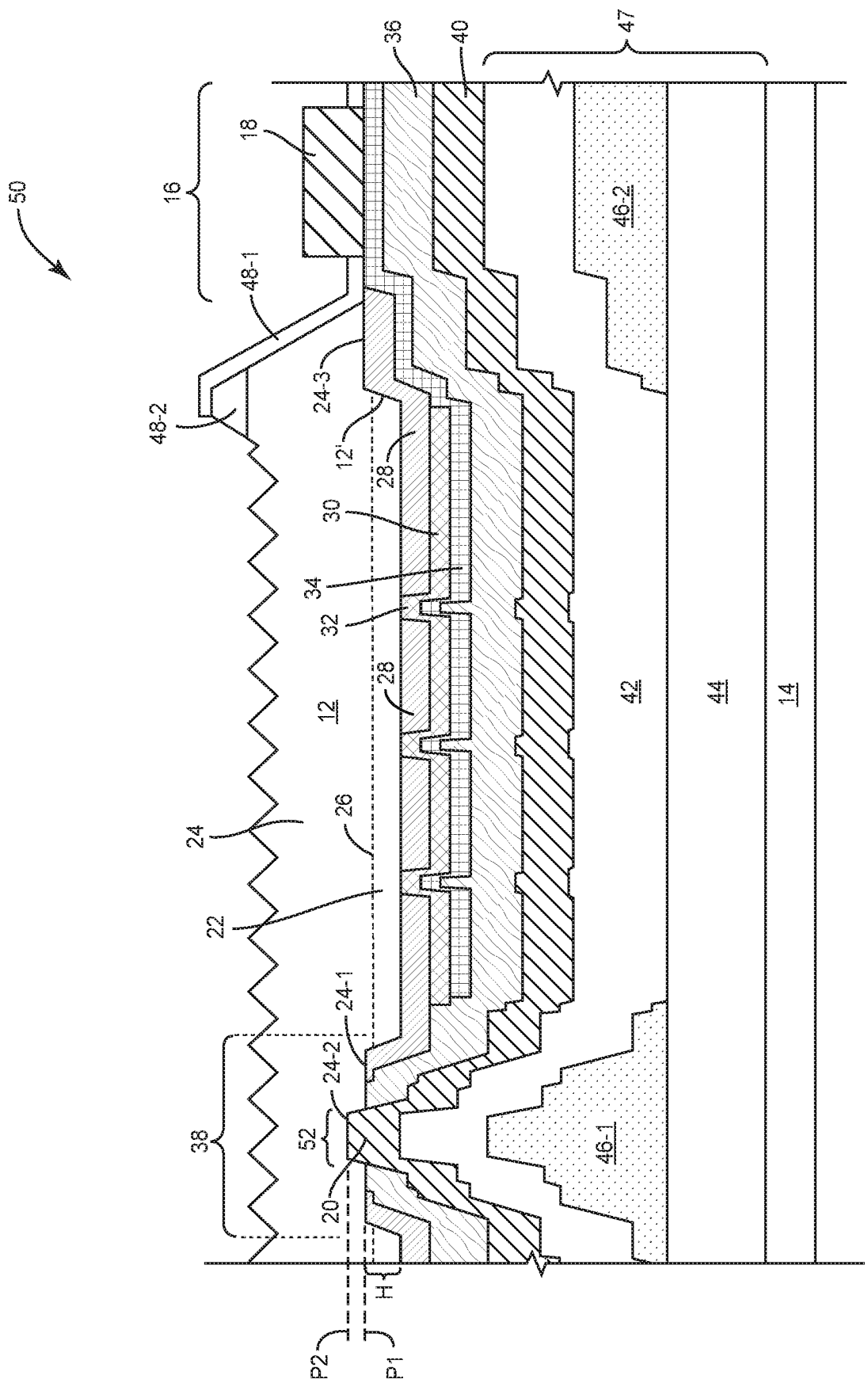
FIG. 3A is partial cross-sectional view of an LED chip with reduced bonding topography according to embodiments disclosed herein.

FIG. 3A is partial cross-sectional view of an LED chip 50 with reduced bonding topography according to embodiments disclosed herein. The cross-sectional view of FIG. 3A is similar to the cross-sectional view of FIG. 2A that corresponds to the sectional line II-II of FIG. 1A. In this regard, the LED chip 50 includes the n-type layer 24, the active layer 26, and the p-type layer 22 of the active LED structure 12 and the carrier submount 14 as previously described for FIG. 2A. Additionally, the LED chip 50 includes the p-contact 18, the first reflective layer 28, the second reflective layer 30, the reflective layer interconnects 32, the barrier layer 34, the passivation layer 36, the n-contact metal layer 40, the n-contact interconnect 20, and the first and second bonding metal layers 42, 44 as previously described for FIG. 2A. In order to reduce bonding topography differences in the bonding regions 46-1, 46-2, the first opening 38 is formed with a reduced height H compared to the LED chip 10 of FIG. 2A. In order to avoid electrical shorting between the n-contact interconnect 20 and the p-type layer 22, the first opening 38 needs only to extend past the p-type layer 22 and the active layer 26 so that one or more of the first reflective layer 28 and the passivation layer 36 are arranged on sidewalls of the p-type layer 22 and the active layer 26 within the first opening 38. In certain embodiments, the height H of the opening is configured to be no more than 1 µm, or no more than 0.8 µm, or in a range including 0.5 µm and 1 µm, or in a range including 0.5 µm and 0.7 µm. For comparison purposes, the height H of the opening in FIG. 2A may be configured to be greater than 1 µm, or in a range including 1 µm to 3 µm, or in a range including 1 µm to 2 µm. In this manner, any reduction in the height H of the first opening 38 reduces distances between the first and second bonding metal layers 42, 44. As such, the bonding region 46-1 has reduced volume to fill during the bonding process, thereby providing improved bonding strength between the active LED structure 12 and the carrier submount 14.

In FIG. 3A, the n-contact interconnect 20 is arranged to extend through the first surface 24-1 of the n-type layer 24 to electrically connect with a second surface 24-2 of the n-type layer 24. In this manner, the n-type layer 24 forms a second opening 52 that extends from the first surface 24-1 and through a second or different portion of the n-type layer 24 than the first opening 38. By forming the second opening 52 through the first opening 38, the second opening 52 may be formed with smaller lateral dimensions than the first opening 38. For example, for cylinder or cone-shaped openings, a lateral diameter of the first opening 38 would be greater than a lateral diameter of the second opening 52 in certain embodiments. As illustrated, the first surface 24-1 of the n-type layer 24 is thereby arranged along a different horizontal plane P1 than a horizontal plane P2 of the second surface 24-2 of the n-type layer 24 such that the second surface 24-2 is formed deeper into the n-type layer 24 than the first surface 24-1. In this regard, the horizontal plane P1 is arranged closer to the active layer 26 than the horizontal plane P2. Notably, the second opening 52 is devoid of the passivation layer 36 and the first reflective layer 28 such that the n-contact interconnect 20 is provided with increased contact area within then n-type layer 24. In this manner, the second opening 52 may be defined where portions of the n-contact metal layer 40 and the n-contact interconnect 20 extend into the n-type layer 24. In certain embodiments, the n-contact interconnect 20 may electrically contact the n-type layer 24 on at least two surfaces of the n-type layer 24, or on at least three surfaces of the n-type layer 24 to provide electrical contact with the n-type layer 24. Accordingly, the n-contact interconnect 20 is electrically connected to n-type layer 24 along the second horizontal plane P2 that is different than the first horizontal plane P1. Notably, the n-contact interconnect 20 is thereby arranged to extend deeper into the n-type layer 24 than both of the first opening 38 and a peripheral mesa border at a third surface 24-3 of the n-type layer 24.

As further illustrated in FIG. 3A, the p-type layer 22, the active layer 26, and the n-type layer 24 form an active LED structure mesa 12' adjacent the peripheral border 16 of the carrier submount 14. The third surface 24-3 of the n-type layer 24 thereby forms the peripheral mesa border of the active LED structure mesa 12'. In certain embodiments, the active LED structure mesa 12' is formed at the same time as the first opening 38 by a masked etching process, and accordingly, the third surface 24-3 is arranged along the same horizontal plane P1 as the first surface 24-1 of the n-type layer 24. In this manner, any reduction in the height H of the first opening 38 reduces distances between the first and second bonding metal layers 42, 44, and in both of the bonding regions 46-1, 46-2. As such, the bonding regions 46-1, 46-2 have reduced volume to fill during the bonding process, thereby providing improved bonding strength between the active LED structure 12 and the carrier submount 14. Notably, the bonding region 46-2 is registered underneath the p-contact 18. In the arrangement of FIG. 3A, the p-contact 18 is configured to receive a wirebond connection. During a typical wirebonding process, an end of a bond wire is pressed and bonded to the p-contact 18. The bond wire is then pulled to tear or shear off an opposite end of the wire for bonding the opposite end to another surface. The pulling step can apply an upward force to the p-contact 18 and any underlying layers that are registered with the p-contact 18, including the passivation layer 36, the n-contact metal layer 40, and the bonding material 47 formed by the first and second bonding metal layers 42, 44 and the bonding region 46-2. By improving the bond strength in the bonding region 46-2, wirebonding to the p-contact 18 may be performed with reduced cracking or other structural failure modes in areas of the LED chip 50 that are registered with the p-contact 18.

Figure 3B:
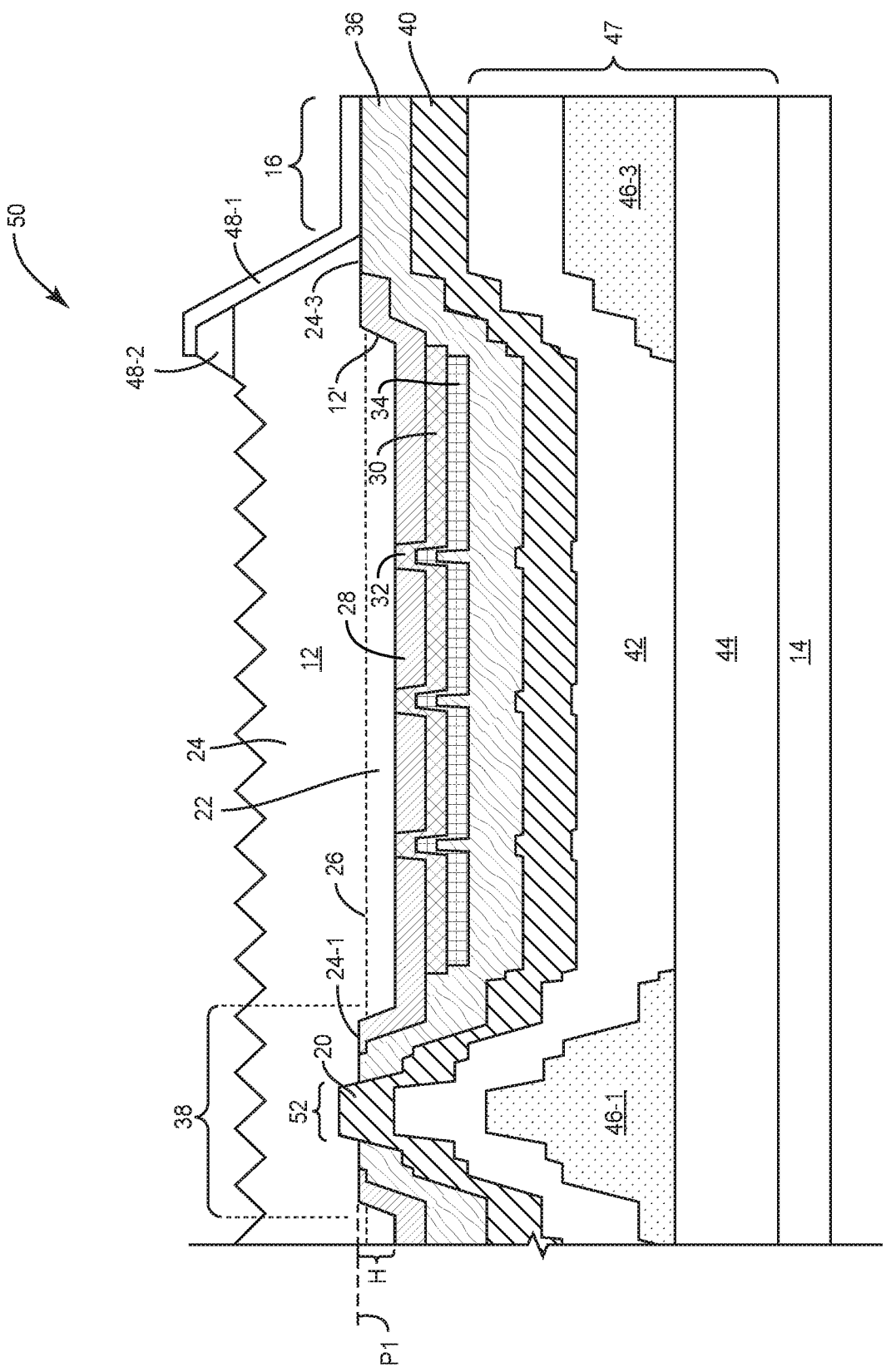
FIG. 3B is a partial cross-sectional view of the LED chip of FIG. 3A that is similar to the cross-sectional view of FIG. 2B that corresponds to the sectional line III-III of FIG. 1A.

FIG. 3B is a partial cross-sectional view of the LED chip 50 of FIG. 3A that is similar to the cross-sectional view of FIG. 2B that corresponds to the sectional line III-III of FIG. 1A. Since the cross-sectional view of FIG. 3B does not include the p-contact (18 of FIG. 3A), the barrier layer 34 does not extend into or across the peripheral border 16 of the carrier submount 14. As the height H of first opening 38 is reduced as compared to the LED chip 10 of FIG. 2A, and the third surface 24-3 is arranged along the same horizontal plane P1 as the first surface 24-1, the first and second bonding metal layers 42, 44 are accordingly arranged closer to one another in the bonding region 46-3. In this manner, the bonding region 46-3 is arranged with reduced volume to fill during the bonding process, thereby providing improved bonding strength between the active LED structure 12 and the carrier submount 14 along the peripheral border 16.

Figure 4A:
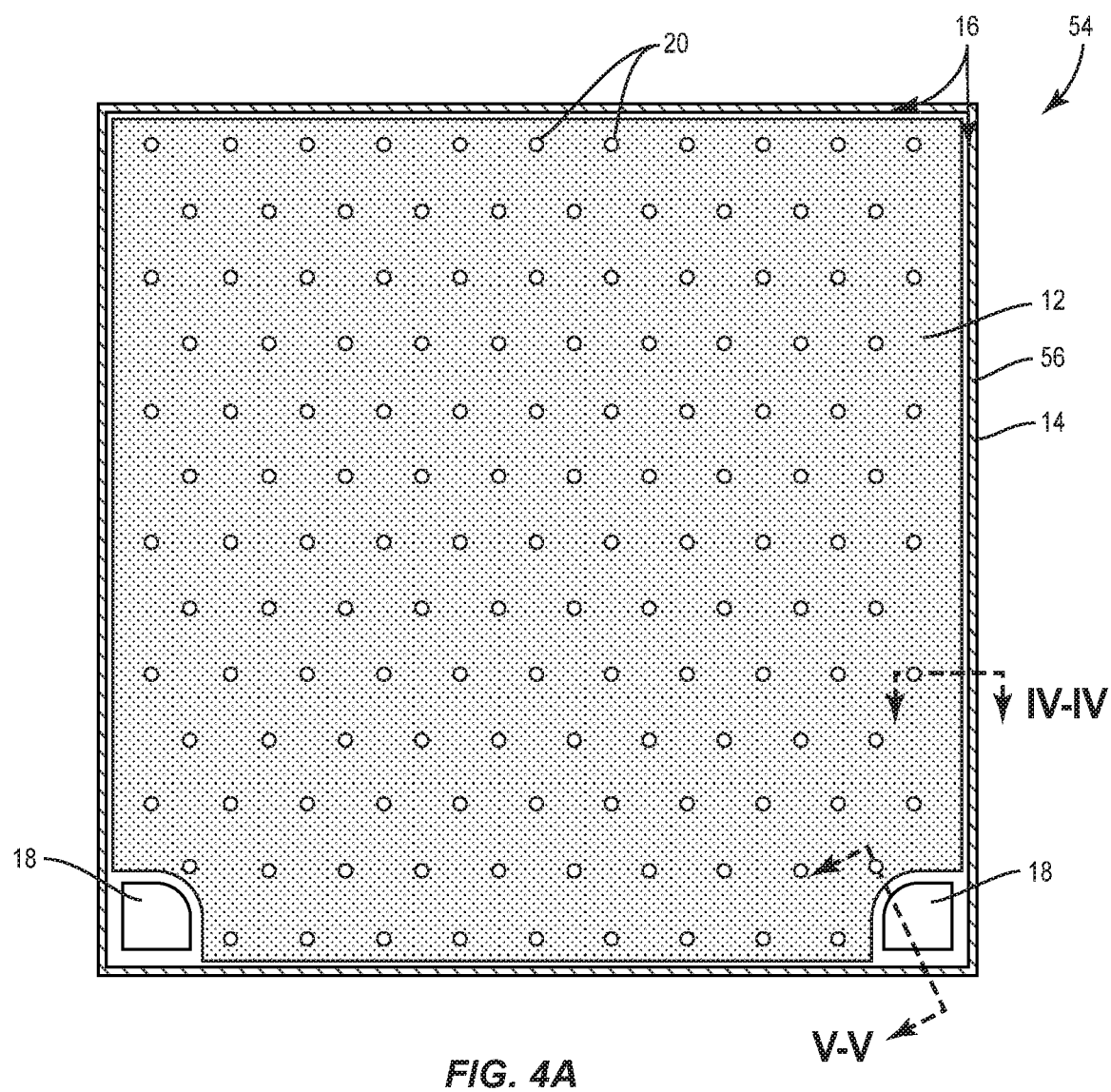
FIG. 4A is a top view illustration of an LED chip with a second passivation layer that is arranged to reduce bonding topography according to additional embodiments disclosed herein.

FIG. 4A is a top view illustration of an LED chip 54 with a second passivation layer 56 that is arranged to reduce bonding topography according to additional embodiments disclosed herein. As illustrated, the LED chip 54 includes at least the active LED structure 12, the carrier submount 14, the p-contacts 18, and the n-contact interconnects 20 as previously described for FIG. 1A. The second passivation layer 56 is arranged along the peripheral border 16.

Figure 4B:
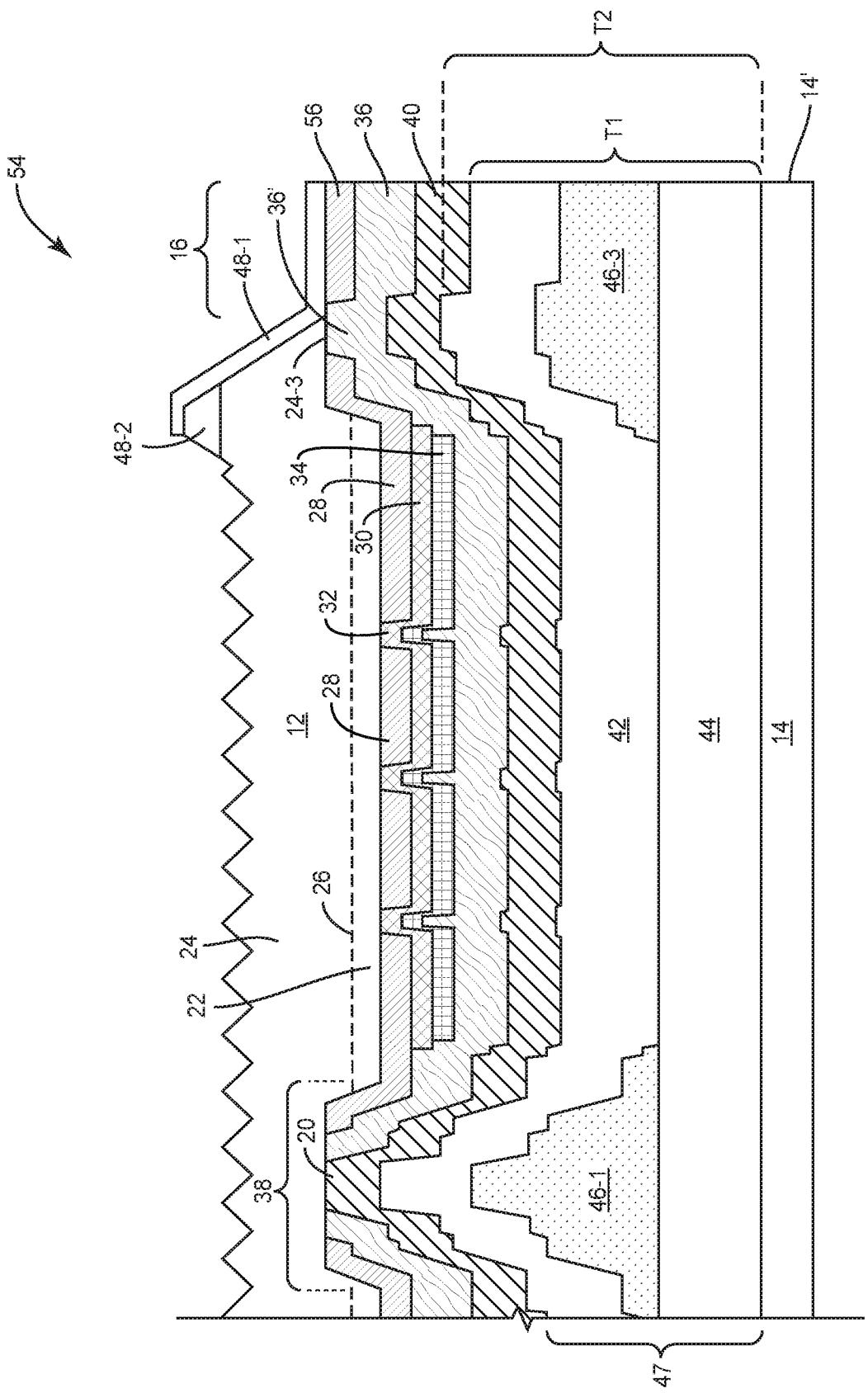
FIG. 4B is partial cross-sectional view of the LED chip of FIG. 4A taken along the sectional line IV-IV.

FIG. 4B is partial cross-sectional view of the LED chip 54 taken along the sectional line IV-IV of FIG. 4A. The cross-sectional view of FIG. 4B is similar to the cross-sectional view of FIG. 2B. In this regard, the LED chip 54 includes at least the n-type layer 24, the active layer 26, and the p-type layer 22 of the active LED structure 12 and the carrier submount 14 as previously described for FIGS. 2A and 2B. Additionally, the LED chip 54 includes the first reflective layer 28, the second reflective layer 30, the reflective layer interconnects 32, the barrier layer 34, the passivation layer 36, the n-contact metal layer 40, the n-contact interconnect 20, and the first and second bonding metal layers 42, 44 as previously described for FIG. 2A. Notably, a second passivation layer 56 is provided along the peripheral border 16 of the carrier submount 14 and outside of the active LED structure 12. In this regard, the second passivation layer 56 and the passivation layer 36 (e.g., the first passivation layer 36) are both arranged along the peripheral border 16. The first passivation layer 36 is additionally arranged between the active LED structure 12 and the carrier submount 14 such that the first passivation layer 36 is continuous from the active LED structure 12 to the peripheral border 16. The second passivation layer 56 is discontinuous with the active LED structure 12 and is laterally spaced from the active LED structure 12 by the first passivation layer 36. In particular, a portion 36' of the first passivation layer 36 is arranged on the third surface 24-3 of the n-type layer 24 (e.g., the peripheral mesa border). Notably, the portion 36' of the first passivation layer 36 is arranged to cover any areas of the third surface 24-3 that are uncovered by the first reflective layer 28. The first passivation layer 36 may additionally be arranged to extend on the second passivation layer 56 such that the first passivation layer 36 is arranged between the second passivation layer 56 and the n-contact metal layer 40 along the peripheral border 16. In this manner, the second passivation layer 56 is laterally spaced from the third surface 24-3 and may accordingly form a stripe of the second passivation layer 56 that is arranged along the peripheral border 16 (as illustrated in FIG. 4A). Turning back to FIG. 4B, the one or more top passivation layers 48-1, 48-2 are provided on portions of the n-type layer 24 over the active LED structure 12 that a portion of the active LED structure 12 is between the one or more top passivation layers 48-1, 48-2 and the carrier submount 14. Additionally, the top passivation layer 48-1 (e.g., a third passivation layer) is arranged to extend across the peripheral border 16 and over both of the first passivation layer 36 and the second passivation layer 56 at the peripheral border 16. In particular, an interface is formed where the portion 36' of the first passivation layer 36 is in contact with the top passivation layer 48-1 that further separates the second passivation layer 56 from the active LED structure 12. In particular, such interface is formed between the first passivation layer 36 and the top passivation layer 48-1 (e.g., third passivation layer) along the peripheral border 16 of the carrier submount 14 and the interface is closer to the active LED structure 12 than the second passivation layer 56. This can be beneficial to provide improved environmental protection for the active LED structure 12 for embodiments where the second passivation layer 56 may comprise a material such as $SiO_2$ that can be susceptible to moisture ingress. In such embodiments, the top passivation layer 48-1 and the first passivation layer 36 may comprise a more environmentally robust material, such as silicon nitride.

In certain embodiments, the second passivation layer 56 comprises a same material as the first reflective layer 28 as described for FIG. 2A. In this regard, the second passivation layer 56 may be formed at the same time as the first reflective layer 28 with a mask covering certain portions of the third surface 24-3 that correspond to where the portion 36' of the first passivation layer 36 will subsequently be provided. As such, the second passivation layer 56 may comprise a dielectric material such as $SiO_2$ or SiN, or a plurality of alternating layers of dielectric materials such as alternating layers of $SiO_2$ and SiN. In other embodiments, the second passivation layer 56 may comprise a same material or different materials than the first reflective layer 28, and the second passivation layer 56 may be provided at a different step than the first reflective layer 28. The presence of the second passivation layer 56 at the peripheral border 16 allows the first bonding metal layer 42 to be arranged closer to the second bonding metal layer 44 of the carrier submount 14, thereby reducing an area or volume of the bonding region 46-3 for improved eutectic bonding. After bonding, the first bonding metal layer 42, the second bonding metal layer 44, and the bonding regions 46-1, 46-3 collectively form the bonding material 47 that is arranged between the carrier submount 14 and the active LED structure 12 and along the peripheral border 16 of the carrier submount 14. At the peripheral border 16, the bonding material 47 forms a first thickness T1 at or adjacent to a lateral edge 14' of the carrier submount 14 that is less than a second thickness T2 of the bonding material 47 along the peripheral border 16 that is farther away from the lateral edge 14'. In particular, the difference between the first thickness T1 and the second thickness T2 corresponds with a thickness of the second passivation layer 56.

Figure 4C:
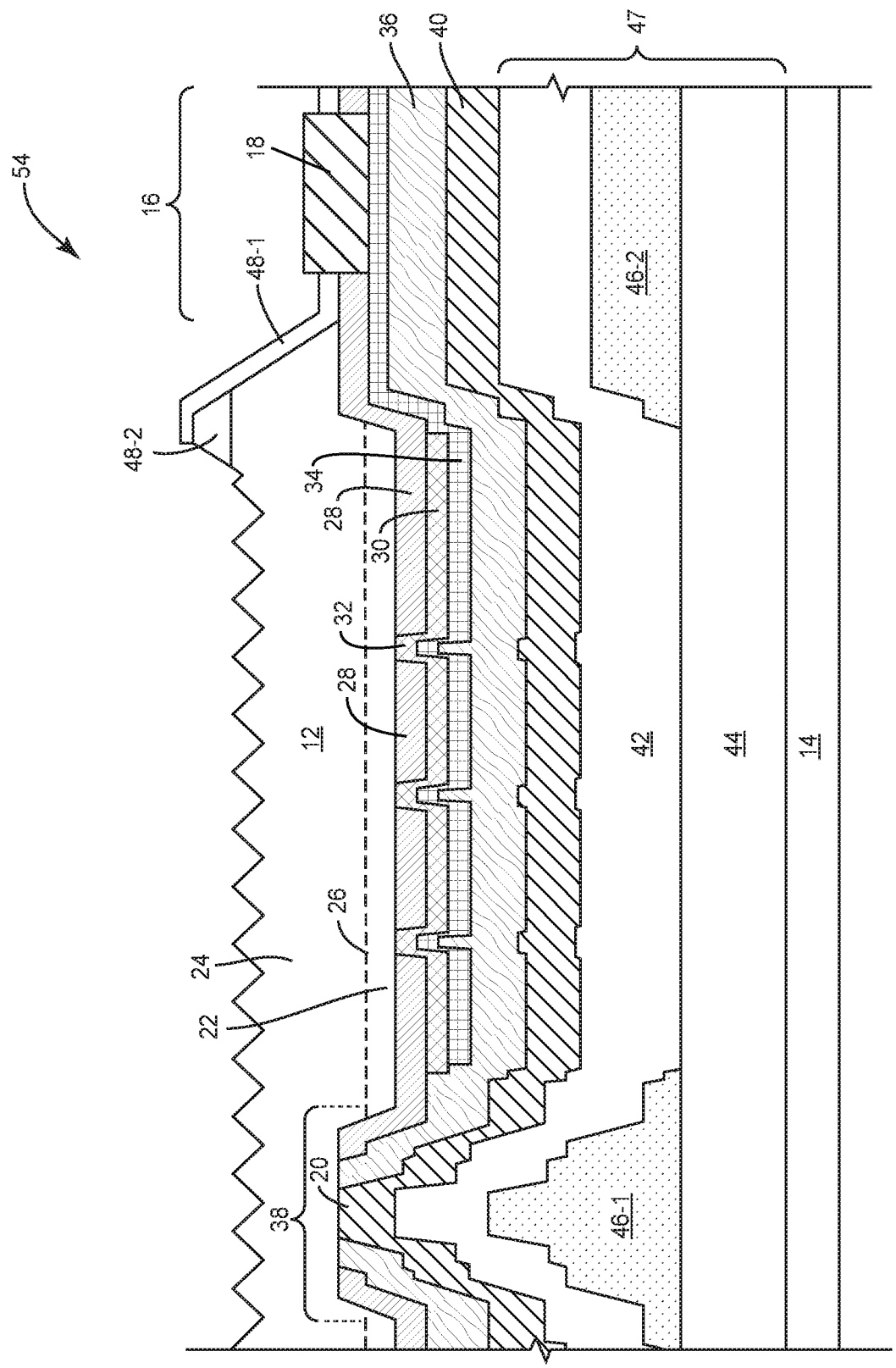
FIG. 4C is partial cross-sectional view of the LED chip of FIG. 4A taken along the sectional line V-V.

FIG. 4C is partial cross-sectional view of the LED chip 54 taken along the sectional line V-V of FIG. 4A. In certain embodiments, the first reflective layer 28 is arranged to extend partially across the peripheral border 16 to a location that corresponds with the p-contact 18. In this manner, the p-contact 18 is arranged to extend through the first reflective layer 28 to provide an electrical connection with the underlying barrier layer 34. As illustrated, the presence of the first reflective layer 28 along the peripheral border 16 positions the barrier layer 34, the first passivation layer 36, the n-contact metal layer 40, and the first bonding metal layer 42 closer to the second bonding metal layer 44. Accordingly, a volume of the bonding region 46-2 is reduced for improved bonding with the carrier submount 14. In FIG. 4C, the first passivation layer 36 may be arranged to contact the top passivation layer 48-1 on either side of the p-contact 18 in a similar manner as described for FIG. 4B.

In FIGS. 4B and 4C, the first opening 38 and the n-contact interconnect 20 are illustrated in a similar manner to FIG. 2A. In other aspects, the embodiments as illustrated in FIGS. 4B and 4C may be combined with the n-contact interconnect 20 arrangements as illustrated in FIG. 3A to further improve bonding.

Figure 5:
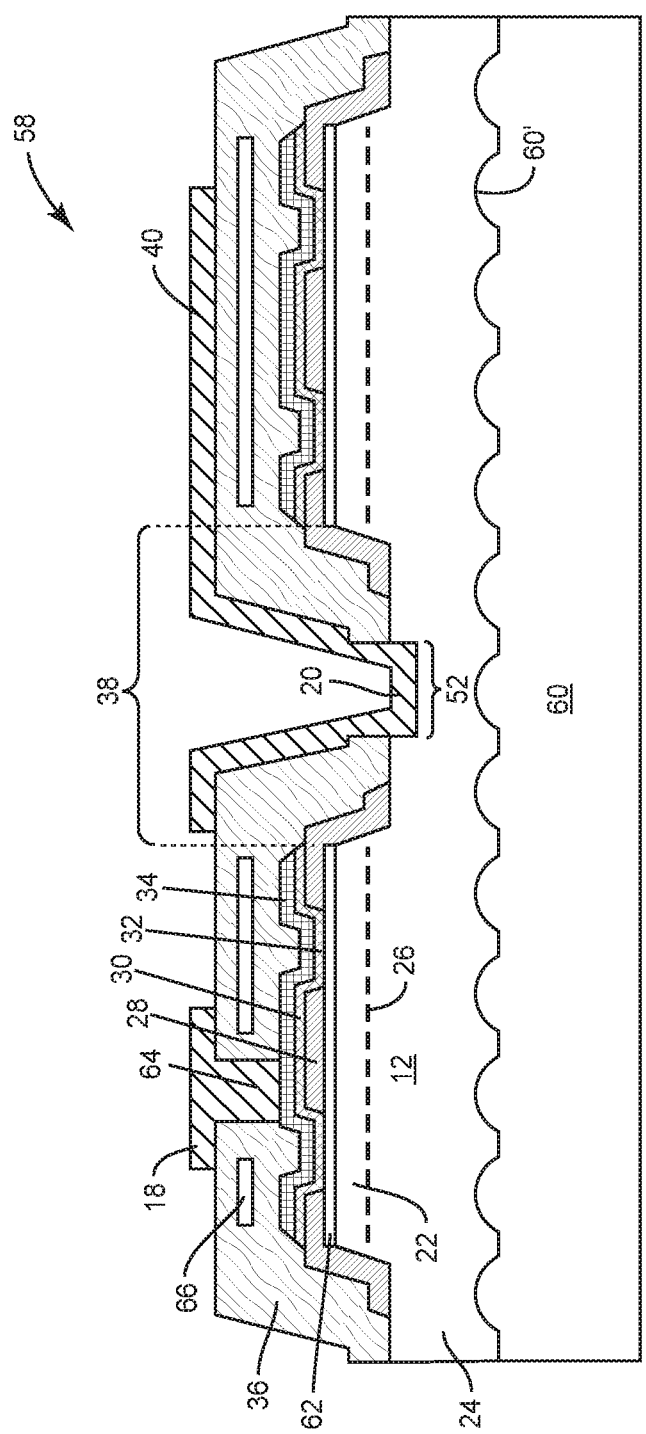
FIG. 5 is a cross-sectional view of an LED chip that includes a light-transmissive substrate according to embodiments disclosed herein.

FIG. 5 is a cross-sectional view of an LED chip 58 that includes a substrate 60 that is light-transmissive according to embodiments disclosed herein. The substrate 60 may comprise many different materials such as SiC or sapphire and can have one or more surfaces that are shaped, textured, or patterned to enhance light extraction. In certain embodiments, the substrate 60 is light transmissive (preferably transparent) and may include a patterned surface 60' that is proximate the active LED structure 12 and includes multiple recessed and/or raised features. In some embodiments, the patterned surface 60' is adjacent the n-type layer 24 of the active LED structure 12. The patterned surface 60' is particularly useful in embodiments in which the substrate 60 comprises sapphire in order to promote extraction of light through an interface between the active LED structure 12 and the substrate 60 as well as providing a suitable growth surface for epitaxial growth of the active LED structure 12. In this regard, the substrate 60 may be referred to as a growth substrate in certain embodiments. As illustrated, the n-type layer 24 is arranged between the substrate 60 and the active layer 26 while the p-type layer 22 is provided farther away from the substrate 60 than the active layer 26. The LED chip 58 may be arranged for flip-chip mounting such that the substrate 60 will form a light-emitting face oriented toward a primary light-emission direction. The LED chip 58 includes many of the same elements as described for FIG. 3A, including the first reflective layer 28, the second reflective layer 30, the reflective layer interconnects 32, the barrier layer 34, the passivation layer 36, the n-contact metal layer 40, the n-contact interconnect 20, and the first and second openings 38, 52. A current spreading layer 62 as previously described for FIG. 2A is visible in FIG. 5. In certain embodiments, the current spreading layer 62 is not present. The n-contact metal layer 40 extends over passivation layer 36 outside of the first opening 38 and forms an n-contact for the LED chip 58. When the LED chip 58 is flip-chip mounted, the n-contact metal layer 40 and the p-contact 18 are bonded to corresponding electrical traces or other electrical connections without the need for wirebonds. Notably, one or more p-contact interconnects 64 may be provided that extend through the passivation layer 36 to the barrier layer 34 or the second reflective layer 30 to provide an electrical path to the p-type layer 22. In certain embodiments, the one or more p-contact interconnects 64 comprise one or more p-contact vias that are formed of the same material or a different material as the p-contact 18. A metal-containing interlayer 66 as previously described for FIG. 2A is also visible in FIG. 5. In certain embodiments, the interlayer 66 may comprise Al or another suitable metal or alloy. Notably, the interlayer 66 is embedded within the passivation layer 36 and is electrically isolated from the rest of the LED chip 58. In application, the interlayer 66 may function as a crack stop layer for any cracks that may propagate through the passivation layer 36. Additionally, the interlayer 66 may reflect at least some light that may pass through both the first reflective layer 28 and the second reflective layer 30. As illustrated in FIG. 5, the n-contact interconnect 20 is arranged to extend through the first opening 38 and within the second opening 52 such that the n-contact interconnect 20 provides increased contact area within then n-type layer 24.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) chip, comprising:
an active LED structure comprising an n-type layer, a p-type layer, and an active layer arranged between the n-type layer and the p-type layer, the active LED structure forming a first opening that extends through the p-type layer, the active layer, and a first portion of the n-type layer;
a passivation layer in the first opening and on a first surface of the n-type layer that is within the first opening, the n-type layer forming a second opening that extends from the first surface of the n-type layer and through a second portion of the n-type layer; and
an n-contact interconnect that extends through the first surface of the n-type layer to electrically connect with a second surface of the n-type layer;
wherein the p-type layer, the active layer, and the n-type layer form an active LED structure mesa, and a third surface of the n-type layer forms a peripheral mesa border of the active LED structure mesa.

2. The LED chip of claim 1, wherein the first surface of the n-type layer and the second surface of the n-type layer are arranged along different horizontal planes of the n-type layer.

3. The LED chip of claim 1, wherein the second opening is devoid of the passivation layer.

4. The LED chip of claim 1, wherein a lateral diameter of the first opening is greater than a lateral diameter of the second opening.

5. The LED chip of claim 1, wherein the third surface of the n-type layer is arranged along a same horizontal plane as the first surface of the n-type layer.

6. The LED chip of claim 1, wherein the active LED structure is bonded to a carrier submount such that the p-type layer is closer to the carrier submount than the n-type layer.

7. The LED chip of claim 6, wherein at least one bonding metal layer is arranged between the p-type layer and the carrier submount.

8. The LED chip of claim 1, further comprising a light-transmissive substrate.

9. The LED chip of claim 1, further comprising a reflective structure on the p-type layer, wherein the reflective structure comprises a dielectric reflective layer and a metal reflective layer.

10. The LED chip of claim 9, wherein the metal reflective layer forms a plurality of reflective layer interconnects that extend through an entire thickness of the dielectric reflective layer.

11. The LED chip of claim 1, further comprising:
a carrier submount bonded to the active LED structure such that a peripheral border of the carrier submount is devoid of the active LED structure, wherein the passivation layer forms a first passivation layer that is arranged between the active LED structure and the carrier submount, and the first passivation layer is further arranged to extend along the peripheral border; and
a second passivation layer arranged along the peripheral border such that the second passivation layer is laterally spaced from the active LED structure by the first passivation layer.

12. The LED chip of claim 1, further comprising:
a carrier submount bonded to the active LED structure such that a peripheral border of the carrier submount is devoid of the active LED structure;
a dielectric reflective layer and a barrier layer on the p-type layer, wherein the dielectric reflective layer and the barrier layer are further arranged to extend along the peripheral border; and
a p-contact arranged along the peripheral border, the p-contact further arranged to extend through the dielectric reflective layer to electrically connect with the barrier layer at the peripheral border.

13. A light-emitting diode (LED) chip, comprising:
an active LED structure comprising an n-type layer, a p-type layer, and an active layer arranged between the n-type layer and the p-type layer, the active LED structure forming an active LED structure mesa with a peripheral mesa border that is arranged along a first horizontal plane of the n-type layer; and
an n-contact interconnect that is arranged through the p-type layer, the active layer, and a portion of the n-type layer such that the n-contact interconnect is electrically connected to the n-type layer along a second horizontal plane of the n-type layer that is different than the first horizontal plane of the n-type layer, wherein the first horizontal plane is arranged closer to the active layer than the second horizontal plane.

14. The LED chip of claim 13, wherein the active LED structure is bonded to a carrier submount.

15. The LED chip of claim 13, further comprising a light-transmissive substrate.

16. A light-emitting diode (LED) chip, comprising:
an active LED structure comprising an n-type layer, a p-type layer, and an active layer arranged between the n-type layer and the p-type layer;
a carrier submount bonded to the active LED structure such that a peripheral border of the carrier submount is devoid of the active LED structure;
a first passivation layer arranged between the active LED structure and the carrier submount, the first passivation layer further arranged to extend along the peripheral border; and
a second passivation layer arranged along only on the peripheral border such that the second passivation layer is laterally spaced from the active LED structure by the first passivation layer.

17. The LED chip of claim 16, wherein the second passivation layer comprises silicon dioxide.

18. The LED chip of claim 16, wherein the first passivation layer comprises silicon nitride.

19. The LED chip of claim 16, wherein the second passivation layer comprises a plurality of alternating layers of dielectric materials.

20. The LED chip of claim 16, wherein the second passivation layer forms a stripe along the peripheral border.

21. The LED chip of claim 16, further comprising a third passivation layer that is over the active LED structure such that a portion of the active LED structure is between the third passivation layer and the carrier submount, the third passivation layer is further arranged over the first passivation layer and the second passivation layer on the peripheral border of the carrier submount.

22. The LED chip of claim 21, wherein an interface is formed between the first passivation layer and the third passivation layer along the peripheral border of the carrier submount and the interface is closer to the active LED structure than the second passivation layer.

23. The LED chip of claim 16, further comprising a bonding material arranged between the carrier submount and the active LED structure and along the peripheral border of the carrier submount.

24. The LED chip of claim 23, wherein along the peripheral border, the bonding material forms a first thickness adjacent a lateral edge of the carrier submount that is less than a second thickness of the bonding material along the peripheral border.

25. The LED chip of claim 16, further comprising a reflective structure on the p-type layer, wherein the reflective structure comprises a dielectric reflective layer and a metal reflective layer.

26. The LED chip of claim 25, wherein the dielectric reflective layer and the second passivation layer comprise the same material.

27. The LED chip of claim 16, further comprising an n-contact interconnect that is electrically connected to the n-type layer, wherein:
the active LED structure forms a first opening that extends through the p-type layer, the active layer, and a first portion of the n-type layer;
the first passivation layer is arranged in the first opening and on a first surface of the n-type layer that is within the first opening;
the n-type layer forms a second opening that extends from the first surface of the n-type layer and through a second portion of the n-type layer; and
the n-contact interconnect extends through the first surface of the n-type layer to electrically connect with a second surface of the n-type layer.

28. The LED chip of claim 16, further comprising:
a dielectric reflective layer and a barrier layer on the p-type layer, wherein the dielectric reflective layer and the barrier layer are further arranged to extend along the peripheral border; and
a p-contact arranged along the peripheral border, the p-contact further arranged to extend through the dielectric reflective layer to electrically connect with the barrier layer at the peripheral border.

* * * * *